United States Patent
Lee et al.

(10) Patent No.: US 8,049,102 B1
(45) Date of Patent: Nov. 1, 2011

(54) SOLAR CELL AND METHOD FOR MANUFACTURING THE SAME

(75) Inventors: Kyoungsoo Lee, Seoul (KR); Jonghwan Kim, Seoul (KR); Juwan Kang, Seoul (KR); Manhyo Ha, Seoul (KR); Daehee Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/898,961

(22) Filed: Oct. 6, 2010

(30) Foreign Application Priority Data

May 11, 2010 (KR) .................. 10-2010-0044128

(51) Int. Cl.
*H01L 31/00* (2006.01)
(52) U.S. Cl. ...................................... 136/258
(58) Field of Classification Search .................. 136/258
See application file for complete search history.

(56) References Cited

U.S. PATENT DOCUMENTS

2001/0039082 A1* 11/2001 Strobl et al. .................. 438/189

FOREIGN PATENT DOCUMENTS

| JP | 9-162433 A | 6/1997 |
| JP | 2002-141522 A | 5/2002 |
| KR | 10-0677374 B1 | 1/2007 |
| KR | 10-0850641 B1 | 7/2008 |

OTHER PUBLICATIONS

Yeong et al. Fabrication method of high efficiency crystalline silicon solar cells, Korean machine translation of KR100850641, Aug. 7, 2008.*

M. Tucci, Optimization of n-doping in ntype a-Si:H/p-type textured c-Si heterojunctionf or photovoltaic applications, 1999, solar energy materials and solar cells, 57, 249-257.*

\* cited by examiner

*Primary Examiner* — Alexa Neckel
*Assistant Examiner* — Miriam Berdichevsky
(74) *Attorney, Agent, or Firm* — Birch, Stewart, Kolasch & Birch, LLP

(57) ABSTRACT

A solar cell includes a substrate of a first conductive type; an emitter part of a second conductive type positioned at a front surface of the substrate; a first silicon thin film layer positioned on the emitter part and including amorphous silicon containing impurities of the second type that are doped therein; a first transparent conductive layer positioned on the first silicon thin film layer and electrically connected with the emitter part; a first electrode positioned on the first transparent conductive layer and electrically connected with the first transparent conductive layer; and a second electrode positioned on a back surface of the substrate. For example, the first silicon thin film layer includes $N^+$-a-Si:H or $N^+$-a-SiC:H.

13 Claims, 9 Drawing Sheets

SOLAR CELL AND METHOD FOR MANUFACTURING THE SAME

This nonprovisional application claims priority under 35 U.S.C. §119(a) to Patent Application No. 10-2010-0044128 filed in Republic of Korea on May 11, 2010, the entire contents of which are hereby incorporated by reference.

BACKGROUND OF THE INVENTION

1. Field of the Invention

Embodiments of the invention relate to a solar cell and method for manufacturing the same.

2. Discussion of the Related Art

Recently, as exhaustion of existing energy resources such as oil or coal is foreseen, interest in alternative energy to replace them is increasing and a solar cell that produces electric energy from solar energy is receiving much attention.

A solar cell is classified into a crystalline solar cell, an amorphous solar cell, a compound-based solar cell, and the like, depending on the kinds of materials used for the solar cell. Further, a crystalline silicon solar cell is classified into a mono-crystalline (or single crystalline) silicon solar cell and a polycrystalline silicon solar cell.

The monocrystalline silicon solar cell, having a high quality substrate, can easily accomplish as high an efficiency, but it is disadvantageous in that a great amount of fabrication cost is incurred. In comparison, the polycrystalline silicon solar cell is disadvantageous in that it cannot accomplish high efficiency because its substrate is inferior to that of the monocrystalline silicon solar cell, but recently, the substrate quality of the polycrystalline silicon solar cell has been improved and, as processing techniques of the polycrystalline silicon solar cell are advancing, the polycrystalline silicon solar cell is becoming highly efficient.

One of methods for making the polycrystalline silicon solar cell highly efficient is by reducing reflectivity of light that is incident to a light reception surface of a substrate.

In order to reduce light reflectivity, the light reception surface of the substrate is formed to have protrusions and depressions. Namely, the substrate is formed to have a textured surface.

However, the solar cell having such a structure has a doubled surface area due to the protrusions and depression formed on the textured surface, so that a recombination rate at the surface increases. Thus, the lowering of the reflectivity brings about the increase in carriers, but because some of the carriers become extinct due to their recombination, an actual current gain is not increased as much as the increase in the carriers.

SUMMARY OF THE INVENTION

In an aspect, a solar cell includes: a substrate of a first conductive type; an emitter part a second conductive type positioned at a front surface of the substrate; a first silicon thin film layer positioned on the emitter part and including amorphous silicon containing impurities of the second type that are doped therein; a first transparent conductive layer positioned on the first silicon thin film layer and electrically connected with the emitter part; a first electrode positioned on the first transparent conductive layer and electrically connected with the first transparent conductive layer; and a second electrode positioned on a back surface of the substrate.

The first silicon thin film layer may include a-Si:H or a-SiC:H having impurities of the second conductive type that are more heavily doped compared with the emitter part. The a-Si:H or a-SiC:H of the first silicon thin film layer may be amorphous silicon hydrogenated to reduce a crystal defect in an amorphous state, which is deposited at a temperature of 200° C. or lower for the hydrogenation through plasma-enhanced chemical vapor deposition (PECVD).

Because the first silicon thin film layer having such a configuration has a high film density, it has superior surface passivation characteristics to those of a silicon nitride film used as a passivation film in the related art. Thus, the first silicon thin film layer has improved step coverage characteristics. Also, because the first silicon thin film layer has a higher band gap (i.e., 1.8 eV) than that of crystalline silicon, it has an increased open circuit voltage, improving a conversion efficiency of the solar cell.

The emitter part may include a textured surface having fine protrusions and depressions. The emitter part may be configured such that a textured surface having a plurality of fine protrusions and depressions is formed at a front surface of the substrate by using dry etching, an emitter layer having a pre-set thickness is formed by spreading impurities at the front surface of the substrate, and at least a portion of the emitter layer having an impurity concentration that is higher than a solid solubility is removed by using dry etching. Thus, the emitter part, a portion of which has been removed by using dry etching, may have a thickness ranging from about 100 nm to 200 nm. Because the region having the impurity concentration higher than the solid solubility is removed from the emitter layer, a carrier mobility of the emitter part can be increased.

A first intrinsic semiconductor layer made of a-Si:H may be positioned between the emitter part and the first silicon thin film layer. In this instance, the first silicon thin film layer and the first intrinsic semiconductor layer may constitute a front passivation film, and the first intrinsic semiconductor layer improves passivation characteristics of the first silicon thin film layer.

The first electrode positioned on the first transparent conductive layer may be formed by printing and baking a paste, for example, first conductive paste comprising silver (Ag), which can be baked at a temperature of 150° C. or lower.

When the silicon thin film layer, the intrinsic semiconductor layer, and the transparent conductive layer are formed only at the front surface of the substrate, a back surface field (BSF) part may be positioned between the substrate and the second electrode. In this instance, the second electrode may be made of a material, e.g., aluminum, different from that of the first electrode.

The back surface field part may be formed at an entire area of the back surface of the substrate or may be formed only at a portion of the back surface of the substrate. When the back surface field part is formed at the entire area of the back surface, the second electrode may be also formed on the entire area of the back surface field part. When the back surface field part is formed only at a portion of the back surface of the substrate, the second electrode may be formed on the entire area of the back surface of the substrate or may be formed only on a portion of the back surface of the substrate corresponding to the back surface field part.

In another aspect, a method for manufacturing a solar cell includes: forming fine protrusions and depressions at a front surface of a first conductive type substrate; injecting impurities into the front surface of the substrate to form an emitter part of a second conductive type, which is an opposite type to the first conductive type; printing and baking a second conductive paste on a back surface of the substrate to form a second electrode; stacking a-Si:H or a-SiC:H having impurities of the second conductive type that are more heavily doped compared with the emitter part at a temperature of 200° C. or lower on the emitter part to form a first silicon thin film layer; forming a first transparent conductive layer on the first silicon thin film layer; and printing a first conductive paste containing silver (Ag) on the first transparent conductive layer and thermally treating the same at a temperature of 150° C. or lower to form a first electrode.

For another example, the silicon thin film layer, the intrinsic semiconductor layer and the transparent conductive layer may be formed on the front surface and on the back surface of the substrate, respectively.

In this instance, the first silicon thin film layer positioned on the front surface of the substrate may be formed as the same conductive type thin film layer as that of the emitter part, and the second silicon thin film layer positioned on the back surface of the substrate may be formed as the same conductive type thin film layer as that of the substrate. The second electrode may be made of the same material, e.g., the same first conductive material, as that of the first electrode and formed at the same time when the first electrode is formed. In this instance, the back surface field part may be formed or may not be formed as necessary.

The solar cell including the first and second silicon thin film layers may have a further increased band gap compared with a solar cell including only the first silicon thin film layer, so its open circuit voltage Voc can be maximized.

In another aspect, a method for manufacturing a solar cell includes: forming fine protrusions and depressions at a front surface of a first conductive type substrate; injecting impurities into the front surface of the substrate to form an emitter part of a second conductive type, which is an opposite type to the first conductive type; stacking a-Si:H or a-SiC:H having impurities of the second conductive type that are more heavily doped compared with the emitter part at a temperature of 200° C. or lower on the emitter part to form a first silicon thin film layer, and stacking a-Si:H or a-SiC:H having impurities of the first conductive type that are more heavily doped compared with the substrate at a temperature of 200° C. or lower on a back surface of the substrate to form a second silicon thin film layer; forming first and second transparent conductive layers on the first and second silicon thin film layers, respectively; and printing a first conductive paste containing silver (Ag) on the first and second transparent conductive layers and thermally treating the same at a temperature of 150° C. or lower to form first and second electrodes.

In another aspect, the transparent conductive layer may not be positioned between the silicon thin film layer and the electrode, and an anti-reflection layer may be instead positioned therebetween.

The anti-reflection layer may be formed as at least one selected from among titanium dioxide layer ($TiO_2$), silicon nitride layer (SiNx), silicon oxide layer (SiOx), and silicon oxynitride layer (SiOxNy), and may have a plurality of contact holes to allow the electrode to be electrically connected with the emitter part therethrough. The contact holes may be formed through a pattern formation method such as laser ablation or the like.

The anti-reflection layer may be formed only on the front surface of the substrate or may be formed on both of the front and back surfaces of the substrate.

Because the silicon thin film layer includes a-Si:H or a-SiC:H having a high film density, it has superior surface passivation characteristics to those of a silicon nitride film used as a passivation film in the related art. Thus, the silicon thin film layer has improved step coverage characteristics.

Also, because the silicon thin film layer has a higher band gap (i.e., 1.8 eV) than that of crystalline silicon, it has an increased open circuit voltage.

Because the region having the impurity concentration higher than the solid solubility is removed from the emitter layer, the mobility of carriers passing through the emitter part can be increased.

The electrode made of the low-temperature paste has better electrical conductivity than a paste baked at a high temperature.

With these characteristics, the solar cell according to example embodiments of the present invention has effectively improved conversion efficiency.

BRIEF DESCRIPTION OF THE DRAWINGS

The example embodiments of the invention will be described in detail with reference to the following drawings in which like numerals refer to like elements.

DETAILED DESCRIPTION OF THE EMBODIMENTS

Figure 1:
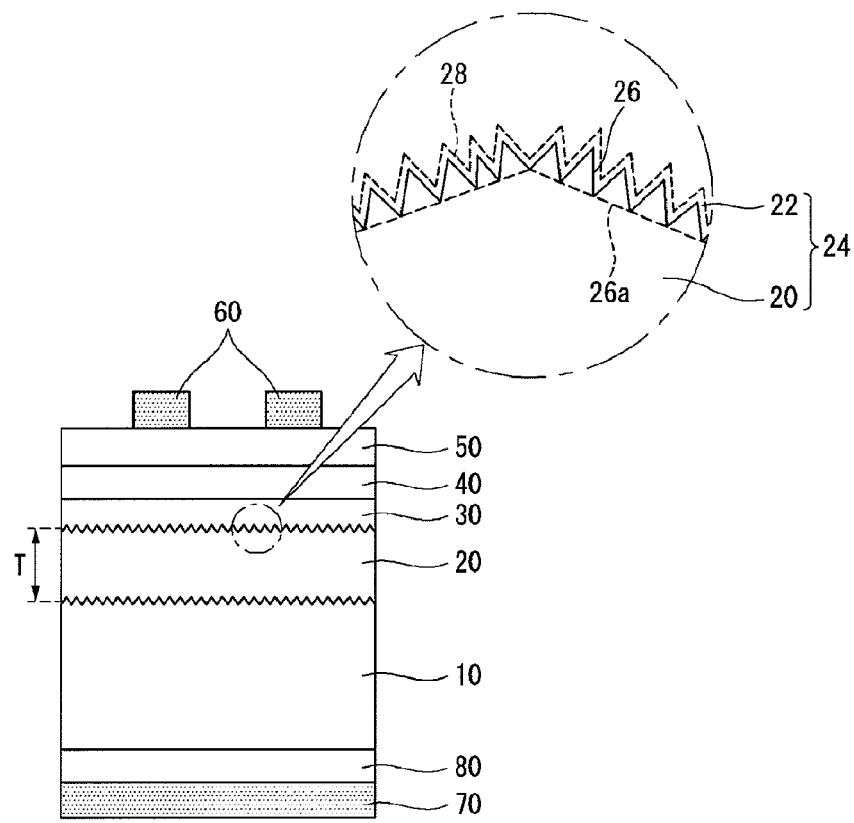
FIG. 1 is a partial sectional view of a solar cell according to a first example embodiment of the present invention.

Example embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

To clarify multiple layers and regions, the thicknesses of the layers are enlarged in the drawings. When it is said that any part, such as a layer, film, area, or plate, is positioned on another part, it refers to the part being directly on the other part or above the other part with at least one intermediate part. On the other hand, if any part is said to be positioned directly on another part, it refers to there being no intermediate part between the two parts.

Exemplary embodiments of the present invention will now be described with reference to the accompanying drawings.

A solar cell according to an example embodiment of the present invention will now be described with reference to the accompanying drawings.

A solar cell according to a first example embodiment of the present invention will now be described with reference to FIGS. 1 to 3.

Figure 2:
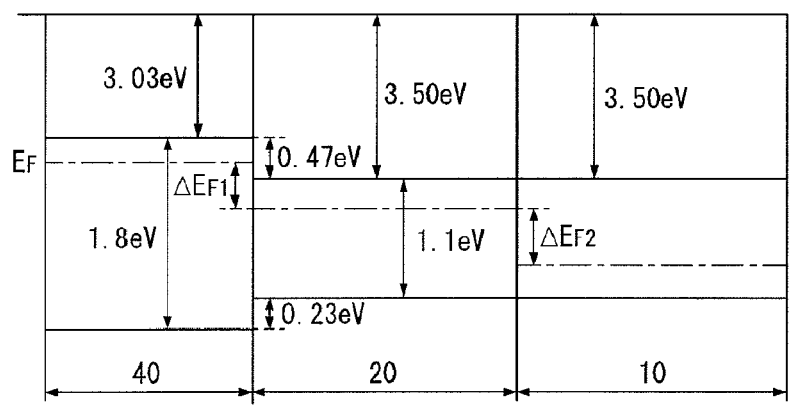
FIG. 2 is a diagram of bands before junctioning the solar cell according to the embodiment of FIG. 1.
Figure 3:
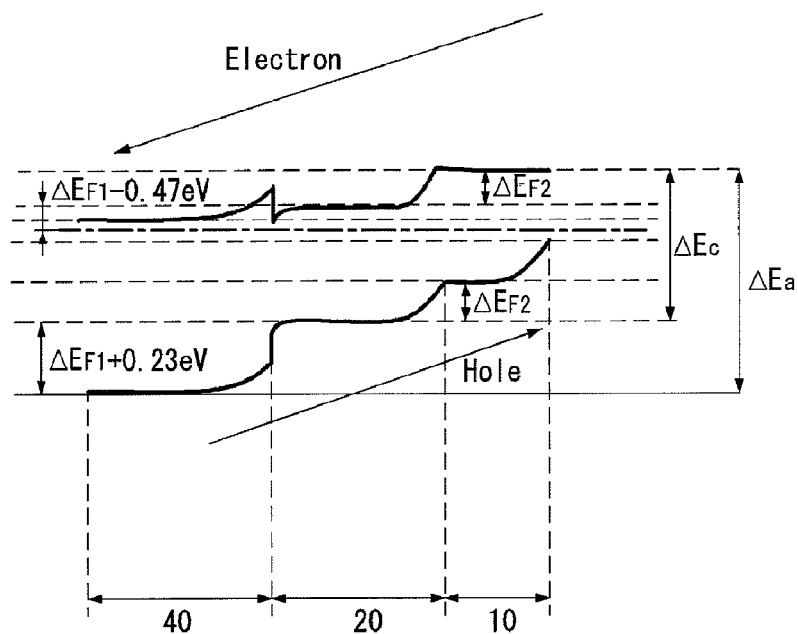
FIG. 3 is a diagram of bands after junctioning the solar cell according to the embodiment of FIG. 1.

FIG. 1 is a partial sectional view of a solar cell according to a first example embodiment of the present invention, FIG. 2 is a diagram of bands before junctioning the solar cell according to the embodiment of FIG. 1, and FIG. 3 is a diagram of bands after junctioning the solar cell according to the embodiment of FIG. 1.

With reference to FIGS. 1 to 3, the solar cell according to the first example embodiment of the present invention comprises a substrate 10, an emitter part 20 positioned on a front surface of the substrate 10 to which light is incident, a first intrinsic semiconductor layer 30 positioned on the emitter part 20, a first silicon thin film layer 40 positioned on the first intrinsic semiconductor layer 30, a first transparent conductive layer 50 positioned on the first silicon thin film layer 40, first electrodes 60 positioned on the transparent conductive layer 50, a second electrode 70 positioned on a back surface of the substrate 10, and a back surface field (BSF) part 80 positioned between the back surface of the substrate 10 and the second electrode 70.

The substrate 10 may be a first conductive type substrate, namely it may be of a first conductive type silicon, for example, a p type conductive silicon.

When the substrate 10 is the p type conductive silicon, it contains impurities of trivalent elements (a group 3 element) such as boron (B), gallium (Ga), indium (In), and the like. However, without being limited thereto, the substrate 10 may be an n type conductive silicon. When the substrate 10 is made of the n type conductive silicon, the substrate 10 may contain impurities of heptavalent elements (a group 5 element) such as phosphor (P), arsenic (As), antimony (Sb), and the like.

The emitter part 20 may be an impurity part having a second conductive type which is opposite to the conductive type of the substrate 110. The emitter part 20 is an impurity part having an n type conductive type, and is positioned on the front surface of the substrate 10 to which light is incident.

As for the emitter part 20, the front surface of the substrate 10 is initially etched through a dry etching method, for example, reaction ion etching (RIE), to have a textured surface 28 having a plurality of fine protrusions and depressions, so that an emitter layer 24 having a certain thickness is formed by spreading impurities at the inner side of the substrate 10. Then, a region 22 of the emitter layer 24 having an impurity concentration higher than a solid solubility thereof may be additionally etched through a dry etching method, e.g., the RIE, to have a textured surface 26.

The reason for removing the region 22 having an impurity concentration higher than the solid solubility thereof is to increase carrier mobility. The emitter layer 24, namely, the emitter part 20, from which the region 22 having an impurity concentration higher than the solid solubility thereof has been removed, has a thickness (T) smaller than that of the emitter layer 24. For example, the emitter part 20 has a thickness (T) ranging from about 100 nm to 200 nm.

The fine protrusions and depressions formed on the textured surface 26 of the emitter part 20 may have a nanometer size, e.g., a width and height ranging from about 300 nm to 800 nm, and an aspect ratio of the fine protrusions and depressions ranges from about 1.0 to 1.5.

The textured surface 26 is formed on another textured surface 26a formed on the front surface of the substrate 10.

In general, the substrate 10 made of polycrystalline silicon is manufactured by slicing a silicon block or an ingot with a blade or a multi-wire saw, and in this instance, a mechanically damaged layer is formed on the substrate 10.

Thus, in order to prevent degradation of the characteristics of the solar cell due to the mechanically damaged layer, wet etching is performed to remove the mechanically damaged layer before the textured surface 26 is formed. In this instance, an alkaline or acid etchant is used for the wet etching.

The textured surface 26a is formed on the surface of the substrate 10 as the substrate 10 is wet-etched, and has protrusions and depressions having a larger size (width and height) than those of the textured surface 26. For example, the protrusions and depressions of the textured surface 26a may have a size of a few μm.

In order to remove the mechanically damaged layer, dry etching may be also used instead of wet etching. In this instance, an RIE may be used as the dry etching method. When the mechanically damaged layer is removed by using the RIE, the protrusions and depressions formed on the textured surface 26a may have a size similar to that of the protrusions and depressions formed on the textured surface 26.

The emitter part 20 forms a p-n junction with the substrate 10. Pairs of electrons and holes, i.e., carriers generated by light that is incident to the substrate 10, are separated into electrons and holes due to a built-in potential difference generated due to the p-n junction, and the electrons transfer toward the n type constituents and the holes transfer toward the p type constituents.

Thus, when the substrate 10 is a p type while the emitter part 20 is an n type, the separated holes transfer toward the substrate 10 and the separated electrons transfer toward the emitter part 20.

When the substrate 10 has the n type conductive type, the emitter part 20 has the p type conductive type. In this instance, the separated electrons transfer toward the substrate 10 and the separated holes transfer toward the emitter 20.

When the emitter part 20 is the n type, the emitter part 20 may be formed by doping impurities of a group 5 element such as phosphor (P), arsenic (As), antimony (Sb), and the like, at the substrate 10. Conversely, when the emitter part 20 is a p type, the emitter part 20 may be formed by doping impurities of a group 3 element such as boron (B), gallium (Ga), indium (In), and the like, at the substrate 10.

The first silicon thin film layer 40 positioned on the emitter part 20 serves to reduce the amount of carriers recombination at the textured surface 26 of the emitter part 20 and increase an open circuit voltage Voc of the solar cell.

To this end, the first silicon thin film layer 40 comprises amorphous silicon having impurities of a second conductive type that are heavily doped therein compared with the emitter part 20. For example, the first silicon thin film layer 40 is made of $N^+$-a-Si:H or $N^+$-a-SiC:H. In this instance, the reason for hydrogenating the amorphous silicon forming the silicon thin film layer 40 is to reduce a crystal defect in the amorphous state to thus improve the surface passivation characteristics and step coverage characteristics.

with reference to FIGS. 2 and 3, the first silicon thin film layer 40 has a band gap (1.8 eV) higher than that of crystalline silicon.

In FIGS. 2 and 3, $E_F$ indicated by an alternated long and short dash line indicates a Fermi energy level of the respective silicon layers, e.g., between the first silicon thin film layer 40, the emitter part 20, and the substrate 10, $\Delta E_{F1}$ indicates a Fermi energy level difference between the first silicon thin film layer 40 and the emitter part 20, and $\Delta E_{F2}$ indicates a Fermi energy level difference between the emitter part 20 and the substrate 10.

Accordingly, as shown in FIGS. 2 and 3, a conduction band ($\Delta$Ea) of the solar cell having the first silicon thin film layer 40 increases by a certain size ($\Delta E_{F1}$+0.23 eV) compared with a conductive band ($\Delta$Ec) of the solar cell that does not have the first silicon thin film layer 40, so the open circuit voltage Voc increases.

Meanwhile, when impurities are injected (or doped) to the a-Si, the surface passivation characteristics may be degraded. Also, because the first silicon thin film layer 40 is used, a band gap mismatch of 0.47 eV occurs.

Thus, in order to restrain the degradation of the surface passivation characteristics and the band gap mismatch, the first intrinsic semiconductor layer 30 made of a-Si:H may be formed between the first silicon thin film layer 40 and the emitter part 20.

When the first intrinsic semiconductor layer 30 is positioned between the first silicon thin film layer 40 and the emitter part 20, the band gap difference can be reduced, thus reducing band bending near a band spike. Also, the surface passivation characteristics of the first silicon thin film layer 40 can be improved.

With such a configuration, a front surface passivation layer comprises the first intrinsic semiconductor layer 30 and the first silicon thin film layer 40. However, without being limited thereto, the front surface passivation layer may be formed to include only the first silicon thin film layer 40.

The first transparent conductive layer 50 positioned on the first silicon thin film layer 40 may be made of transparent conductive oxide (TCO). The first transparent conductive layer 50 reduces a contact resistance, thus improving carrier mobility.

The first electrodes 60 are electrically connected with the first transparent conductive layer 50 and extend in parallel in a predetermined direction. The first electrodes 60 collect carriers, e.g., electrons, which transfer toward the emitter part 20.

A plurality of collectors may be positioned to cross the first electrodes 60 on the first transparent conductive layer 50, and in this instance, the collectors and the first electrodes 60 may be electrically and physically connected to each other.

The first electrodes 60 are made of a first conductive paste. The first conductive paste is a material containing silver (Ag) baked at a low temperature of 150° C. or lower. Because the conductive paste is baked at a low temperature, it exhibits excellent electric conductivity compared with conductive paste baked at a high temperature, thus improving the carrier collection efficiency.

The second electrode 70 is positioned substantially on the entire area on the back surface of the substrate 10. The second electrode 70 contains a conductive material such as aluminum (Al) and is electrically connected with the substrate 10.

The second electrode 70 collects carriers, e.g., holes, moving from the substrate 10, and outputs them to an external device.

The second electrode 70 may contain at least one conductive material selected from the group consisting of nickel (Ni), copper (Cu), silver (Ag), tin (Sn), zinc (Zn), indium (In), titanium (Ti), gold (Au), and any of their combinations, instead of aluminum (Al), and also may contain any other conductive material.

The BSF part 80 positioned between the second electrode 70 and the substrate 10 is a region, e.g., a P+ region, heavily doped with the impurities of the same conductive type as those of the substrate 10.

The BSF part 80 having such a configuration forms a potential barrier between the BSF part 80 and the substrate 10, which interferes with transfer of electrons toward the back surface of the substrate 10 to reduce the phenomenon that electrons and holes are recombined to become extinct in the vicinity of the back surface of the substrate 10.

Figure 4:
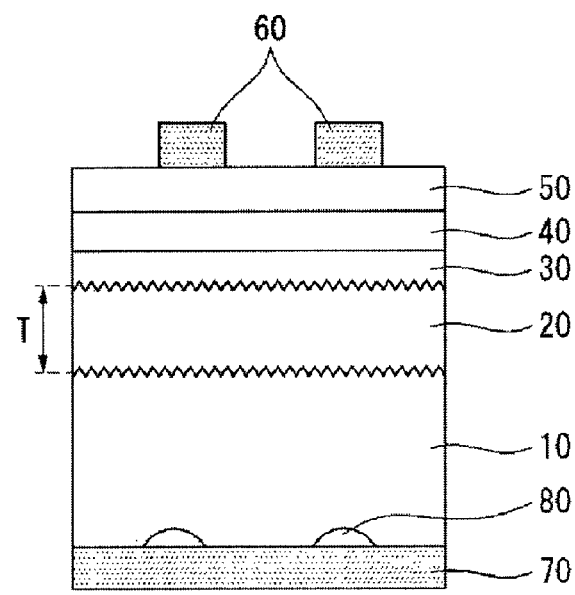
FIG. 4 is a partial sectional view of a modified embodiment of the solar cell of FIG. 1.

In FIG. 1, it is illustrated that the BSF part 80 is formed on the entire area of the back surface of the substrate 10, but the present invention is not limited thereto and, as shown in FIG. 4, the BSF part 80 may be formed only at a portion of the back surface of the substrate 10.

When the BSF part 80 is formed only at a portion of the back surface of the substrate 10, the second electrode 70 may be formed on the entire area of the back surface of the substrate 10, or the second electrode 70 may be formed only at a portion of the substrate 10 in the same form as that of the first electrodes 60.

When the second electrode 70 and the BSF part 80 are formed on the entire area of the back surface of the substrate, the BSF part 80 may be formed by injecting (or doping) impurities into the entire area of the back surface of the substrate before the second electrode 70 is formed, or by injecting (or doping) impurities to the entire area of the back surface of the substrate 10 in the process of baking the second electrode 70.

When the second electrode 70 and the BSF part 80 are formed only at a portion of the back surface of the substrate 10, the BSF part 80 may be formed by injecting (or doping) impurities into a portion of the back surface of the substrate 10 corresponding to the second electrode 70 in the process of baking the second electrode 70.

Although the second electrode 70 is formed on the entire area of the back surface of the substrate 10, if the BSF part 80 is formed only at a portion of the back surface of the substrate 10, the BSF part 80 may be formed by locally heating a portion of the second electrode 70 by using laser to inject (or dope) impurities into a portion of the back surface of the substrate.

A plurality of collectors may be positioned on the back surface of the substrate 10. The plurality of collectors positioned on the back surface of the substrate 10 are electrically connected to the second electrode 70, collect carriers transferred from the second electrode 70, and outputs the same to an external device.

A method for manufacturing a solar cell according to the first example embodiment of the present invention will now be described with reference to FIGS. 1 and 5.

First, one surface, e.g., the front surface, of the substrate 10 is wet-etched to form a surface that corresponds to the textured surface 26a and to remove a mechanically damaged layer, and subsequently, the textured surface 28 having a plurality of fine protrusions and depressions is formed by using a dry etching method such as RIE.

In this instance, the substrate 10 is made of a p type polycrystalline silicon, but the present invention is not limited thereto and the substrate 10 may be made of n type monocrystalline or amorphous silicon. The textured surface 26a may be formed through the dry etching method.

The fine protrusions and depressions of the textured surface 28 formed through the dry etching method may have a size of hundreds of nanometers, e.g., a width and diameter ranging from about 300 nm to 800 nm, and may have an aspect ratio ranging from about 1.0 to 1.5.

When the surface of the substrate 10 is textured through the dry etching method according to the present example embodiment, reflectance (or reflectivity) (e.g., an average weighted reflectance) of light of a wavelength ranging from about 300 nm to 1,100 nm is reduced to a reflectance of about 10 percent or lower.

In this instance, the RIE for forming the textured surface 28 may be performed as follows.

First, the substrate 10 is positioned in a processing chamber having the pressure of about 0.1 mTorr to 0.5 mTorr, an etching gas, a mixture gas ($SF_6/Cl_2$) of $SF_6$ and $Cl_2$, is injected (or doped) into the processing chamber. In this instance, the mixture ratio of the etching gas ($SF_6/Cl_2$) may be about 10:0 to 2.

Then, power having a pre-set size is applied to two electrodes installed about the substrate 10 to generate plasma in the space between the two electrodes to thus perform dry etching by plasma.

In this instance, the size of the power applied to the electrodes may be about 3000 $W/m^2$ to 6000 $W/m^2$.

After the textured surface 28 is formed on the substrate 10, a material, e.g., $POCl_3$ or $H_3PO_4$, etc., containing impurities of a group 5 element such as phosphor (P), arsenic (As), antimony (Sb), and the like, is thermally treated at a high temperature to spread the impurities of group 5 element to the substrate 10 to form the emitter layer (24 in FIG. 1).

When the conductive type of the substrate 10 is an n type, a material, e.g., $B_2H_6$, containing impurities of a group 3 element may be thermally treated at a high temperature to form the emitter layer (24 in FIG. 1).

The doping density of the impurities of the thusly formed emitter layer (24 in FIG. 1) is reduced toward the interior of the substrate 10 from the surface of the substrate 10.

Namely, because the impurities are spread toward the interior of the substrate 10 from the surface of the substrate 10, the closer they are to the surface of the substrate 10, namely, to the textured surface 28, the doping density of the impurities is greater, and the farther they are from the textured surface 28, the doping density of the impurities is lesser.

Accordingly, because the surface side of the substrate has been injected (or doped) with the impurities more than or exceeding a solid solubility, concentration of the inactive impurities increases at the surface side of the substrate 10.

For example, when a $POCl_3$ gas is spread to the p type silicon substrate 10 to form an n type emitter layer 24, clusters of phosphor may be formed within the substrate 10, an Si—P structure in which silicon (Si) and phosphor (P) element are combined is formed within the substrate 10, or phosphor (P) element may solely exist within the substrate 10, and because these are not normally combined with silicon (Si), they act as inactive impurities.

As afore-mentioned, because the impurity concentration increases toward the surface of the substrate 10, the inactive impurity concentration also increases toward the surface of the substrate 10. Thus, a region 22 having the impurity concentration higher than the solid solubility, namely, a dead layer, is formed due to the presence of the inactive impurities gathering near the surface of the substrate 10, and a carrier loss is caused by the inactive impurities existing in the dead layer, resulting in a reduction in the efficiency of the solar cell.

Thus, in order to prevent or reduce the carrier loss due to the dead layer, the dead layer, namely, the region 22 having the impurity concentration higher than the solid solubility is removed by using the RIE in a similar manner as the etching method used for the formation of the textured surface 28 to form the emitter layer 24.

In this instance, as for the etching conditions for removing the dead layer, the size of power applied for a plasma formation is set to be smaller than the foregoing range of about 3000 $W/m^2$ to 6000 $W/m^2$, while the same pressure and etching gas in the processing chamber are used.

Namely, the pressure of the processing chamber is maintained to be 0.1 mTorr to 0.5 mTorr, a mixture gas of $SF_6$ and $Cl_2$ is used as an etching gas, and the mixture ratio of the etching gas ($SF_6/Cl_2$) may be about 10:0 to 2.

Preferably, though not necessarily, power of about 300 $W/m^2$ to 600 $W/m^2$ is applied to the electrode. The reason is because if the size of the power applied to the electrode is greater than about 600 $W/m^2$, the surface of the emitter layer 24 is damaged due to plasma and an excessive amount of emitter layer 24 is removed to increase a surface resistance value of the emitter part 20, and if the size of the power applied to the electrode is smaller than about 300 $W/m^2$, plasma cannot be normally generated to cause failure to effectively remove the dead layer.

As stated above, because the dead layer of the emitter layer 24 is removed through the RIE, an etching degree of the surface of the emitter layer 24 is substantially uniform irrespective of positions.

Thus, after the portion of the emitter layer 24 is removed, the textured surface 26 of the emitter part 20 is substantially consistent with the shape of the textured surface 28 before the etching process is performed on the emitter layer.

After the emitter part 20 is formed, second conductive paste containing aluminum (Al) is printed through a screen printing method, dried and then baked to form the second electrode 70 on the back surface of the substrate 10.

In this instance, a drying temperature of the second electrode 70 may range from 120° C. to 200° C., and the baking temperature of the second electrode 70 may be 800° C. or higher.

When the second conductive paste is baked, the BSF part 80 is formed between the second electrode 70 and the substrate 10.

Thereafter, the first intrinsic semiconductor layer 30 made of i-a-Si:H is formed on the emitter part 20. Subsequently, the first silicon thin film layer 40, e.g., $N^+$-a-Si:H or $N^+$-a-SiC:H, is formed on the first intrinsic semiconductor layer 30. The first silicon thin film layer 40 is hydrogenated amorphous silicon for reducing a crystal defect in the amorphous state, which is deposited through PECVD at a low temperature of 200° C. or lower for its hydrogenation.

Subsequently, the first transparent conductive layer 50, e.g., a TCO film, is formed on the first intrinsic semiconductor layer 40, and the first conductive paste is printed on the first transparent conductive layer 50, which is then baked to form the first electrodes 60.

Here, the first intrinsic semiconductor layer 30 and the first silicon thin film layer 40 constitute a front surface passivation layer. The front surface passivation layer may be configured only with the first silicon thin film layer 40.

In this instance, the first conductive paste contains silver (Ag), and a baking temperature of the first conductive paste is 150° C. or lower.

Because the first electrodes 60 are positioned on the first transparent conductive layer 50, the first conductive paste may not contain glass frit for a punch-through.

For another example, a contact hole may be formed in the first silicon thin film layer 40 and the first intrinsic semiconductor layer 30, and the first transparent conductive layer may be then formed, or after the contact hole is formed, the first electrodes 60 may be then formed without forming the first transparent conductive layer 50.

A solar cell and its manufacturing method according to a modified embodiment of FIG. 1 will now be described with reference to FIGS. 6 to 9.

The modified embodiment is different from the example embodiment of FIG. 1 in that second electrodes 70a positioned on the back surface of the substrate 10 are made of the same material as that of the first electrodes 60 and a second intrinsic semiconductor layer 30a, a second silicon thin film layer 40a, and a second transparent conductive layer 50a are sequentially positioned between the substrate 10 and the second electrode 70a, while the BSF part (80 in FIG. 1) is omitted.

Here, the second intrinsic semiconductor layer 30a and the second silicon thin film layer 40a constitute a back surface passivation layer. The back surface passivation layer may be configured only with the second silicon thin film layer 40a.

In this instance, the second intrinsic semiconductor layer 30a may be made of the same material as that of the first intrinsic semiconductor layer 30, the second silicon thin film layer 40a may be formed to have the opposite conductive type to that of the first silicon thin film layer 40, and the second transparent conductive layer 50a may be made of the same material as that of the first transparent conductive layer 50. Accordingly, the second silicon thin film layer 50a is made of P+-a-Si:H or P+-a-SiC:H.

A conduction band ($\Delta Eb$) of the solar cell having such a configuration is increased by a certain size ($\Delta E_{F3}$+0.47 eV) compared with a conduction band ($\Delta Ea$) of the solar cell according to the first example embodiment illustrated in FIG. 1, so the open circuit voltage Voc can be further increased compared with the solar cell according to the first example embodiment illustrated in FIG. 1. Here, $\Delta E_{F3}$ is a Fermi energy level difference between the substrate 10 and the second silicon thin film layer 40a.

Figure 6:
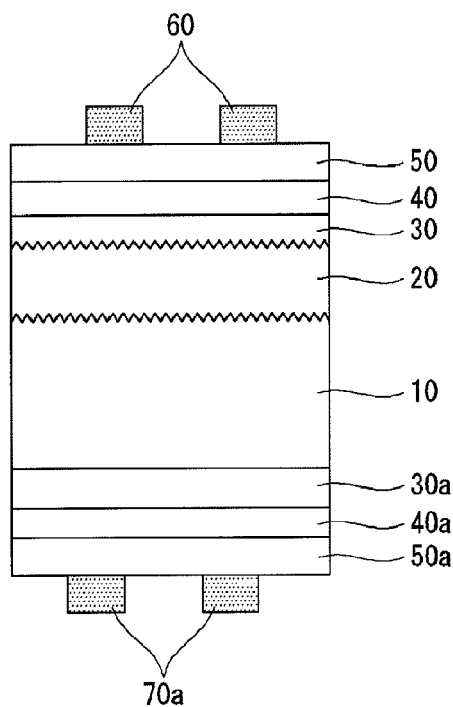
FIG. 6 is a partial sectional view of another modified embodiment of the solar cell of FIG. 1.
Figure 7:
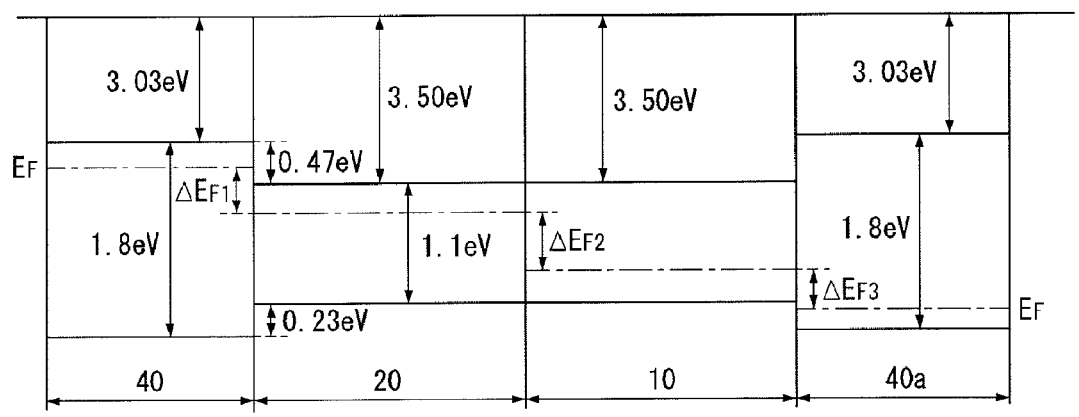
FIG. 7 is a diagram of bands before junctioning the solar cell according to the embodiment of FIG. 6.
Figure 8:
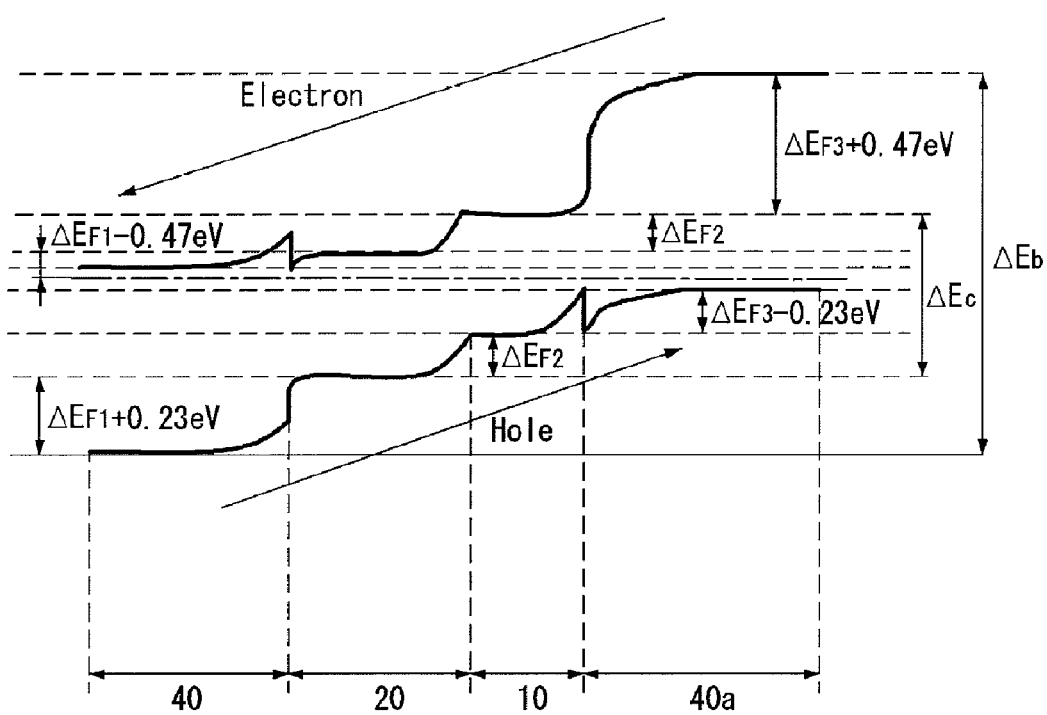
FIG. 8 is a diagram of bands after junctioning the solar cell according to the embodiment of FIG. 6.

The solar cell having the foregoing configuration can be manufactured according to the method described hereinafter with reference to FIGS. 6 and 9.

Figure 5:
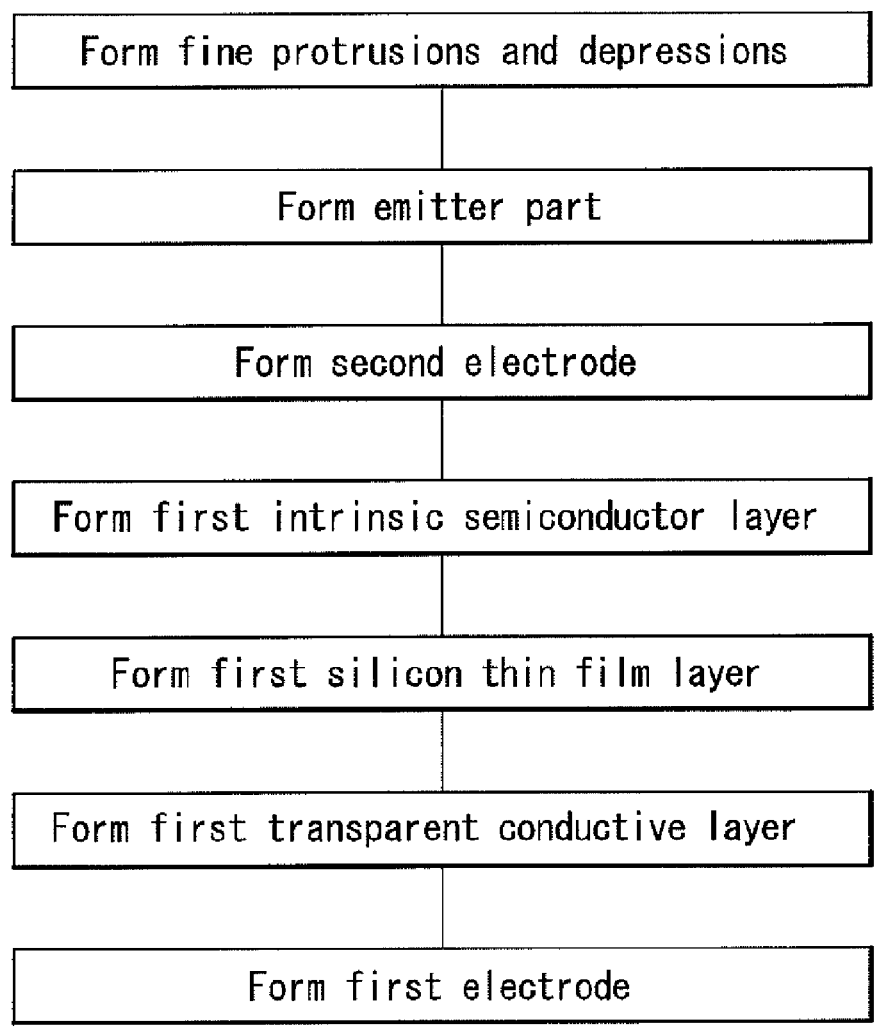
FIG. 5 is a flow chart illustrating processes of a method for manufacturing a solar cell according to the embodiment of FIG. 1.

First, after the emitter part 20 is formed according to the example embodiments of FIGS. 1 and 5, the first intrinsic semiconductor layer 30 and the second intrinsic semiconductor layer 30a are formed on the emitter part 20 and on the back surface of the substrate 10, respectively.

Next, the first silicon thin film layer 40 is formed on the first intrinsic semiconductor layer 30, and the second silicon thin film layer 40a is formed on the second intrinsic semiconductor layer 30a.

In this instance, the first silicon thin film layer 40 is formed by depositing N+-a-Si:H or N+-a-SiC:H heavily doped with second conductive type impurities (N+), compared with the emitter part 20, at a temperature of 200° C. or lower, and the second silicon thin film layer 40a is formed by depositing P+-a-Si:H or P+-a-SiC:H heavily doped with first conductive type impurities (P+), compared with the substrate 10, at a temperature of 200° C. or lower.

Then, the first transparent conductive layer 50 and the second transparent conductive layer 50a are formed on the first silicon thin film layer 40 and on the second silicon thin film layer 40a, respectively.

Thereafter, a first conductive paste containing silver (Ag) is printed on the first and second transparent conductive layers 50 and 50a, respectively, and baked at a low temperature of 150° C. or lower to form the first electrodes 60 and the second electrodes 70a, thus manufacturing the solar cell.

A solar cell and its manufacturing method according to a second example embodiment of the present invention will now be described with reference to FIGS. 10 and 11.

The solar cell according to the second example embodiment of the present invention is different from that of the first example embodiment of the present invention in that the first transparent conductive layer (50 in FIG. 1) is omitted and a first anti-reflection layer 90 is formed at the position of the omitted first transparent conductive layer.

The first anti-reflection layer 90 may be formed of at least one selected from among titanium dioxide layer ($TiO_2$), silicon nitride layer (SiNx), silicon oxide layer (SiOx), and silicon oxynitride layer (SiOxNy). The anti-reflection layer 90 serves to reduce reflectivity of light that is incident to the solar cell and increase selectivity of a particular wavelength region (or a particular wavelength band), to thus enhance the efficiency of the solar cell.

Here, the first intrinsic semiconductor layer 30, the first silicon thin film layer 40, and the first anti-reflection layer 90 constitute a front surface passivation layer. The front surface passivation layer may be configured only with the first silicon thin film layer 40 and the first anti-reflection layer 90.

The first anti-reflection layer 90 made of the foregoing material comprises a plurality of contact holes 92 allowing the first electrodes 60 made of the first conductive paste to be electrically connected with the emitter part 20 through the first silicon thin film layer 40.

In this instance, the contact holes 92 may be formed through a patterning process such as laser ablation or the like.

Accordingly, because the first electrodes 60 are electrically connected with the emitter portion 20 through the contact holes 92, the first conductive paste may not (or need not) contain glass frit for a punch-through.

Figure 10:
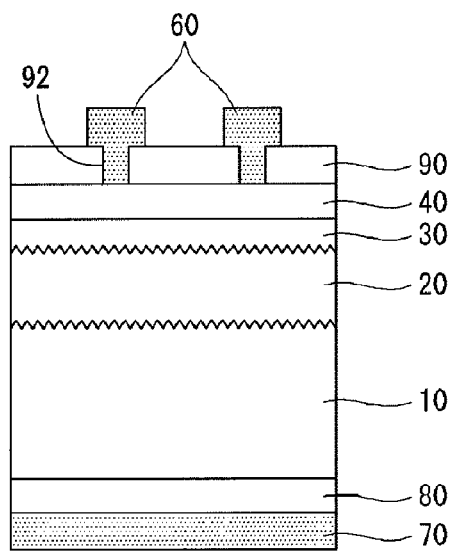
FIG. 10 is a partial sectional view of a solar cell according to a second example embodiment of the present invention.
Figure 11:
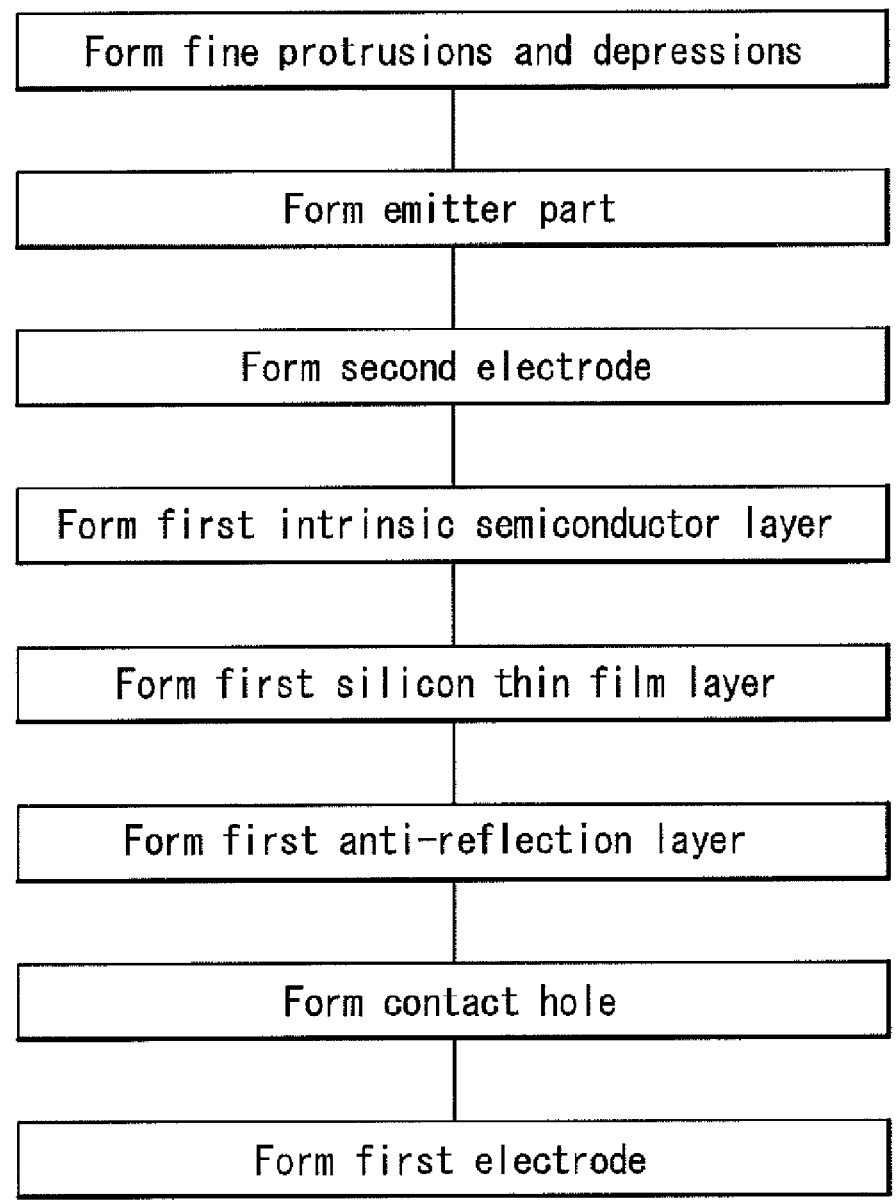
FIG. 11 is a flow chart illustrating processes of a method for manufacturing a solar cell according to the embodiment of FIG. 10.

In the solar cell having such a configuration, the BSF part 80 may be formed on the entire area of the back surface of the substrate 10 as shown in FIG. 10 or may be formed only at a portion of the back surface of the substrate 10 as shown in FIG. 4.

The solar cell having the foregoing configuration has the effect of increasing the open circuit voltage owing to the increase in the band gap like the solar cell according to the first example embodiment of the present invention of FIG. 1.

A solar cell and its manufacturing method according to a second exemplary example embodiment of the present invention will now be described with reference to FIGS. 10 and 11.

In order to manufacture the solar cell according to the present example embodiment, first, the emitter part 20, the second electrode 70, the BSF part 80, the first intrinsic semiconductor layer 30, and the first silicon thin film layer 40 are formed according to the manufacturing method similarly illustrated in FIGS. 1 and 5.

Next, the first anti-reflection film 90 is formed on the first silicon thin film layer 40, the plurality of contact holes 92 are formed in the first anti-reflection layer 90 through a patterning process such as laser ablation or the like, and then the first conductive paste is printed on the portions where the contact holes 92 are formed, and baked to form the first electrodes 60, thus manufacturing the solar cell.

Figure 12:
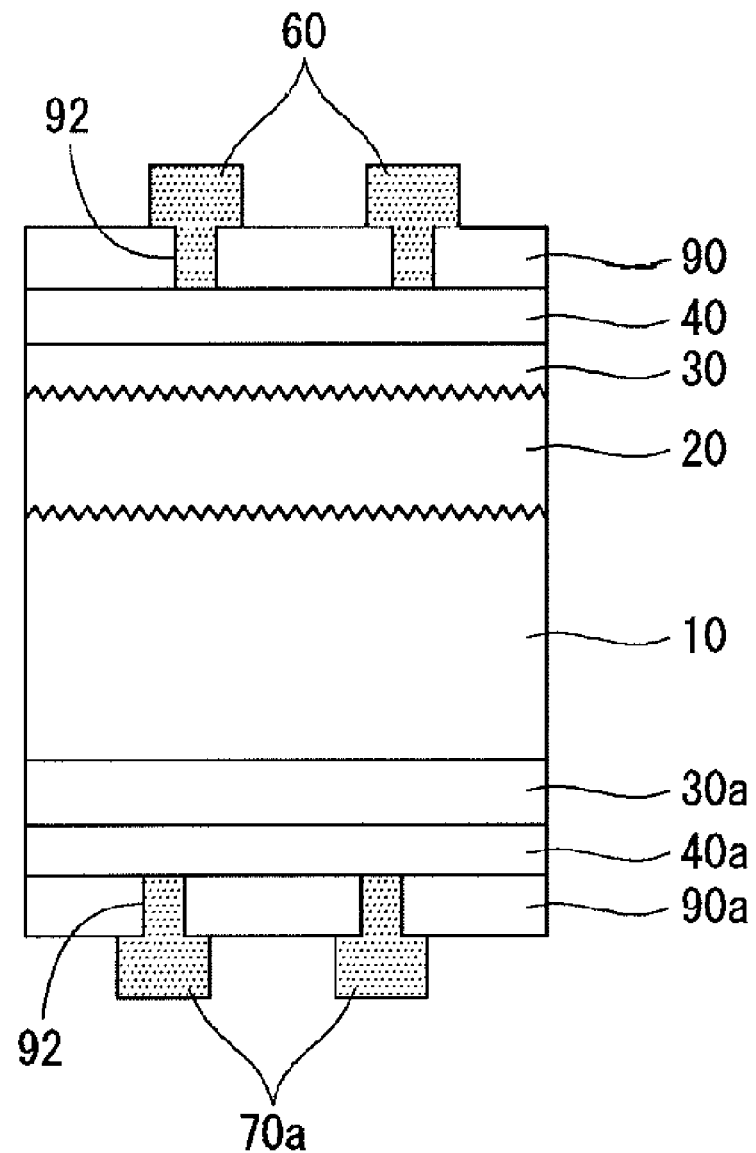
FIG. 12 is a partial sectional view of a modified embodiment of the solar cell of FIG. 10.
Figure 13:
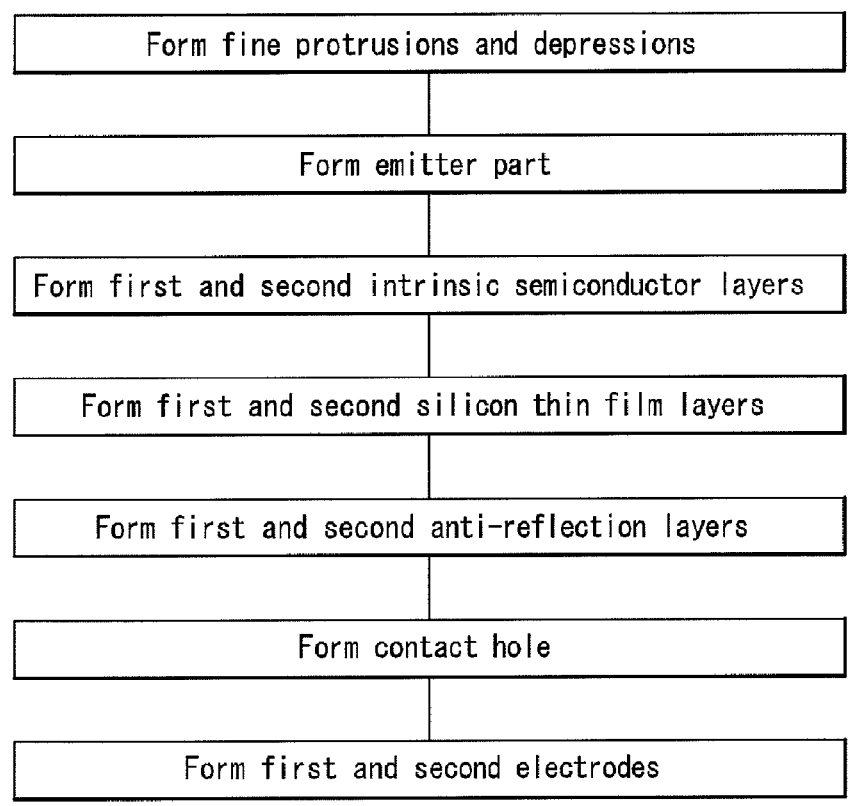
FIG. 13 is a flow chart illustrating processes of a method for manufacturing a solar cell according to the embodiment of FIG. 12.

FIG. 12 is a partial sectional view of a modified embodiment of the solar cell of FIG. 10, and FIG. 13 is a flow chart illustrating the process of a method for manufacturing a solar cell according to the embodiment of FIG. 12.

The solar cell according to the modified embodiment is different from the solar cell according to the second example embodiment of the present invention in that second electrodes 70a positioned on the back surface of the substrate 10 are made of the same material as that of the first electrodes 60 and a second intrinsic semiconductor layer 30a, a second silicon thin film layer 40a, and a second anti-reflection layer 90a are sequentially positioned between the substrate 10 and the second electrode 70a, while the BSF part (80 in FIGS. 1 and 9) is omitted.

Here, the second intrinsic semiconductor layer 30a, the second silicon thin film layer 40a, and the second anti-reflection layer 90a constitute a back surface passivation layer. The back surface passivation layer may be configured only with the second silicon thin film layer 40a and the second anti-reflection layer 90a in an embodiment of the invention.

In this instance, the second intrinsic semiconductor layer 30a may be made of the same material as that of the first intrinsic semiconductor layer 30, the second silicon thin film layer 40a may be formed to have the opposite conductive type to that of the first silicon thin film layer 40, and the second anti-reflection layer 90a may be made of the same material as that of the first anti-reflection layer 90. Accordingly, the second silicon thin film layer 50a is made of $P^+$-a-Si:H or $P^+$-a-SiC:H.

The solar cell having the foregoing configuration has the effect of increasing the open circuit voltage owing to the increase in the band gap like the solar cell according to the first example embodiment of the present invention of FIG. 5.

The solar cell according to the present example embodiment may be manufacture according to the method described hereinafter with reference to FIG. 13.

Figure 9:
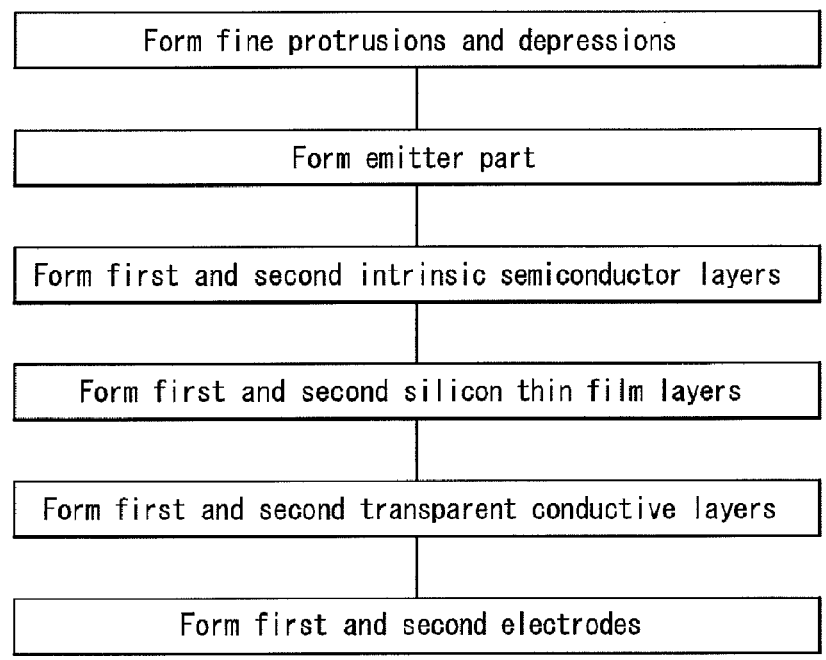
FIG. 9 is a flow chart illustrating processes of a method for manufacturing a solar cell according to the embodiment of FIG. 6.

First, the emitter part 20, the first intrinsic semiconductor layer 30, the second intrinsic semiconductor layer 30a, the first silicon thin film layer 40, and the second silicon thin film layer 40a are formed according to the manufacturing method similarly illustrated in FIGS. 5 and 9.

Next, according to the method as described above, the first anti-reflection layer 90 and the second anti-reflection layer 90a are formed on the first silicon thin film layer 40 and the second silicon thin film layer 40a, respectively, the plurality of contact holes 92 are formed, the first conductive paste containing silver (Ag) is printed on the first and second anti-reflection layers 90 and 90a, respectively, which are then baked at a low temperature of 150° C. or lower to form the first and second electrodes 60 and 70a, thus manufacturing the solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A solar cell, comprising:
a substrate of a first conductive type;
an emitter part of a second conductive type and positioned at a front surface of the substrate;
a first silicon thin film layer positioned on the emitter part and comprising amorphous silicon containing impurities of the same conductive type as the emitter part that are doped therein;
a first intrinsic semiconductor layer positioned between the emitter part and the first silicon thin film layer;
a first transparent conductive layer positioned on the first silicon thin film layer and electrically connected with the emitter part;
a first electrode positioned on the first transparent conductive layer and electrically connected with the first transparent conductive layer; and
a second electrode positioned on a back surface of the substrate.
2. The solar cell of claim 1, wherein the first silicon thin film layer comprises a-Si:H or a-SiC:H having impurities of the second conductive type that are more heavily doped compared with the emitter part.
3. The solar cell of claim 1, wherein the emitter part comprises a textured surface having fine protrusions and depressions.
4. The solar cell of claim 3, wherein the emitter part has a thickness ranging from about 100 nm to 200 nm.
5. The solar cell of claim 1, wherein the first intrinsic semiconductor layer comprises a-Si:H.
6. The solar cell of claim 1, further comprising a back surface field part positioned between the substrate and the second electrode.
7. The solar cell of claim 6, wherein the back surface field part is formed at an entire area of the back surface of the substrate, and the second electrode is formed on an entire area of a back surface of the back surface field part.
8. The solar cell of claim 6, wherein the back surface field part is formed only at a portion of the substrate, and the second electrode is formed on an entire area of the back surface of the substrate or only on a portion of the back surface of the substrate corresponding to the back surface field part.
9. The solar cell of claim 1, further comprising a second silicon thin film layer positioned between the substrate and the second electrode.
10. The solar cell of claim 9, wherein the second silicon thin film layer comprises a-Si:H or a-SiC:H having impurities of the first conductive type that are more heavily doped compared with the substrate.
11. The solar cell of claim 9, further comprising a second intrinsic semiconductor layer positioned between the substrate and the second silicon thin film layer.
12. The solar cell of claim 11, wherein the second intrinsic semiconductor layer comprises a-Si:H.
13. The solar cell of claim 9, further comprising a second transparent conductive layer positioned between the second silicon thin film layer and the second electrode.

* * * * *